(12) United States Patent
Lee et al.

(10) Patent No.: US 6,180,478 B1
(45) Date of Patent: Jan. 30, 2001

(54) FABRICATION PROCESS FOR A SINGLE POLYSILICON LAYER, BIPOLAR JUNCTION TRANSISTOR FEATURING REDUCED JUNCTION CAPACITANCE

(75) Inventors: Chwan-Ying Lee, Tainan; Tzuen-Hsi Huang, Doou Liow; Tsyr-Shyang Liou, Yeong Kang, all of (TW)

(73) Assignee: Industrial Technology Research Institute, Hsin-Chu (TW)

( * ) Notice: Under 35 U.S.C. 154(b), the term of this patent shall be extended for 0 days.

(21) Appl. No.: 09/294,171

(22) Filed: Apr. 19, 1999

(51) Int. Cl.$^7$ .................................................. H01L 21/331
(52) U.S. Cl. ..................... 438/309; 438/350; 438/364; 438/365
(58) Field of Search ..................... 438/309, 350, 438/364, 365, 368, 700; 257/578, 579, 584, 592

(56) References Cited

U.S. PATENT DOCUMENTS

| | | |
|---|---|---|
| 5,071,778 | 12/1991 | Solheim . |
| 5,592,017 | 1/1997 | Johnson ................................ 257/554 |
| 5,593,905 | 1/1997 | Johnson et al. . |
| 5,736,447 | 4/1998 | Choi et al. ........................... 438/365 |
| 5,773,350 | 6/1998 | Herbert et al. ...................... 438/364 |
| 5,786,622 | * 7/1998 | Ronkainen ........................... 257/578 |
| 5,869,380 | 2/1999 | Chang .................................. 438/309 |

* cited by examiner

*Primary Examiner*—David Nelms
*Assistant Examiner*—Dung A Le
(74) *Attorney, Agent, or Firm*—George O. Saile; Stephen B. Ackerman

(57) ABSTRACT

A process for fabricating a bipolar junction transistor, (BJT), featuring reduced junction capacitance, resulting from the decreased dimensions of extrinsic, and intrinsic base, regions, has been developed. The BJT device, is comprised with only a single polysilicon level, used for the emitter structure, while an extrinsic base, and intrinsic base region, are accommodated in an epitaxial silicon layer, grown on an underlying silicon, active device region, and grown on a silicon seed layer, which in turn overlays insulator isolation regions. A boron doped, intrinsic base region can be formed in an undoped version of the epitaxial silicon layer, or the boron doped, intrinsic base region can be contained in the as deposited, epitaxial silicon layer, or contained in an as deposited, epitaxial, silicon-germanium layer.

21 Claims, 7 Drawing Sheets

FABRICATION PROCESS FOR A SINGLE POLYSILICON LAYER, BIPOLAR JUNCTION TRANSISTOR FEATURING REDUCED JUNCTION CAPACITANCE

BACKGROUND OF THE INVENTION (1) Field of the Invention

The present invention relates to methods used to fabricate semiconductor devices, and more specifically to a method used to fabricate a bipolar junction transistor, (BJT), on a semiconductor substrate.

(2) Description of Prior Art

Bipolar junction transistors, offering enhanced performance when compared to metal oxide semiconductor field effect transistor, (MOSFET), devices, have been used to improve the performance of bipolar-complementary MOS, (BiCMOS), chips, specifically chips used for microprocessor applications. The enhanced performance of BJT devices, is a result of a faster switching frequency, offered via reductions in the base width of the BJT device. In addition reductions in RC delays, accomplished via the use conductive extrinsic base layers, as well as accomplished via capacitance reductions, in turn obtained via the use of micro-miniaturization processing of specific regions of the BJT device, have also allowed increased BJT performance to be realized.

This invention will describe a fabrication process for a BJT device in which only a single polysilicon layer is used, for the emitter level, while extrinsic base, and intrinsic base regions, are formed in an epitaxial silicon base layer, deposited on underlying silicon seed layer, and on an underlying N type, epitaxial layer, with the intrinsic base region either formed in an undoped, epitaxial silicon base layer, or contained in the deposited epitaxial silicon base layer. These features result in a reduction in BJT area, specifically the reduction of base-collector, as well as collector-substrate capacitance, thus reducing performance degrading RC delays. This invention will also describe procedures in which the epitaxial silicon base layer is a composite epitaxial layer, used for the intrinsic base region, comprised of either a boron doped, silicon layer, or a boron doped, silicon-germanium layer, which increases transistor switching frequency, (Ft), again resulting in enhanced performance. Prior art, such as Solheim, in U.S. Pat. No. 5,071, 778, describes a process for improving the device characteristics of a BJT device, via a self-aligned collector implant. However that prior art does not describe the unique processing features used in this invention, resulting in improved BJT performance, such as an epitaxial silicon layer, providing for both an extrinsic and intrinsic base region.

SUMMARY OF THE INVENTION

It is an object of this invention to fabricate a BJT device, in which RC delays are reduced as a result of reducing junction capacitance.

It is another object of this invention to reduce junction capacitance via a reduction in the area of base-collector, and collector to substrate, regions.

It is still another object of this invention to use only a single polysilicon layer, for the emitter structure, while an epitaxial silicon layer is deposited in an active device region, providing the material for the accommodation of an extrinsic base region, as well as for the intrinsic base region, thus reducing the active device region of the BJT, as well as junction capacitance, when compared to counterpart BJT devices, fabricated with double polysilicon layers.

It is yet another object of this invention to either ion implant an intrinsic base region, into an epitaxial silicon layer, or to provide an epitaxial silicon region, deposited with the intrinsic base region.

In accordance with the present invention a method of fabricating a bipolar junction transistor, (BJT), has been developed, featuring reduced junction capacitance, via reductions in the area of the active device region, and enhanced device performance, accomplished via the use of a epitaxial grown layer, formed on the active device region, providing for both the extrinsic and intrinsic base regions. After formation of an N+ subcollector region, and of P well, buried layer isolation regions, in a P type semiconductor substrate, an N type, epitaxial silicon layer is deposited. After formation of a collector reach through region, as well as field oxide, (FOX), isolation regions, a silicon seed layer, comprised of either amorphous silicon, or polysilicon, is formed on the surface of the FOX regions, and extending to overlay a portion of the active device region, located between FOX regions. An epitaxial silicon base layer is deposited on the underlying silicon seed layer, as well as on the underlying N type, epitaxial silicon layer, exposed in the active device region. The epitaxial silicon base layer can be deposited intrinsically, requiring a first photolithographic and ion implantation procedure, to convert a first portion of the epitaxial silicon base region, to a P type, extrinsic base region, followed by a second photolithographic and ion implantation procedure, used to convert a second portion of the epitaxial silicon base layer to a P type, intrinsic base region, in an area directly overlying the active device region. The photolithographic and ion implantation procedures, used to create the intrinsic base regions, can however be omitted via deposition of an epitaxial silicon base layer, already containing either the specific level of P type dopant, needed for the intrinsic base region, or containing the specific level of P type dopant, in addition to a specific level of germanium, needed for an enhanced, P type, intrinsic base region. After opening an emitter contact hole, in an insulator layer, exposing a portion of the top surface of the intrinsic base region, an N type, polysilicon emitter structure is formed. An anneal cycle is next performed to allow N type diffusion from the overlying N type polysilicon emitter structure, to form a shallow emitter region, in the top portion of the P type, intrinsic base region, exposed in the emitter contact hole, resulting in a P type, intrinsic base region, located between the overlying, diffused emitter region, and the underlying collector region, or the N type, epitaxial silicon layer. Deposition of a thick insulator layer, and opening of contact holes in the thick insulator layer: to the N type, polysilicon emitter structure; to the P type, extrinsic base region; and to the collector reach through region; is followed by formation of metal contact structure, located in the contact holes, contacting the underlying emitter, base, and collector regions.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
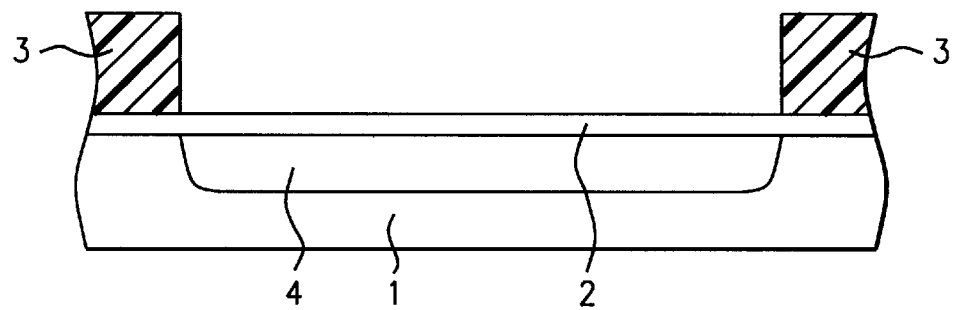
FIGS. 1–17, which schematically, in cross-sectional style, show the key stages of fabrication, used to create a single polysilicon, BJT device, featuring lower junction capacitance, resulting from a reduced active device region area, accomplished via an extrinsic and intrinsic base region, incorporated in a epitaxial layer.

The method of fabricating a single polysilicon, BJT device, with reduced junction capacitance, as a result of a decreased active device region, featuring an extrinsic, and an intrinsic base region, formed in an epitaxial silicon layer, which is deposited on an underlying collector region, and on a silicon seed layer, will now be described in detail. A P type, semiconductor substrate 1, comprised of single crystalline silicon, with a <100> crystallographic orientation, is used and schematically shown in FIG. 1. A silicon oxide layer 2, used as a screen oxide for a subsequent ion implantation procedure, is thermally grown, to a thickness between about 100 to 300 Angstroms. Photoresist shape 3, is used as a mask to allow an ion implantation procedure, performed at an energy between about 70 to 90 KeV, and at a dose between about 4E15. to 6E15 atoms/cm$^2$, to place antimony, or arsenic ions in a region of semiconductor substrate 1, not protected by photoresist shape 3. After removal of photoresist shape 3, via plasma oxygen ashing and careful wet cleans, an anneal procedure is performed at a temperature between about 1100 to 1250° C., in a nitrogen ambient, activating the antimony, or arsenic ions, creating buried subcollector region 4, schematically shown in FIG. 1.

Figure 2:
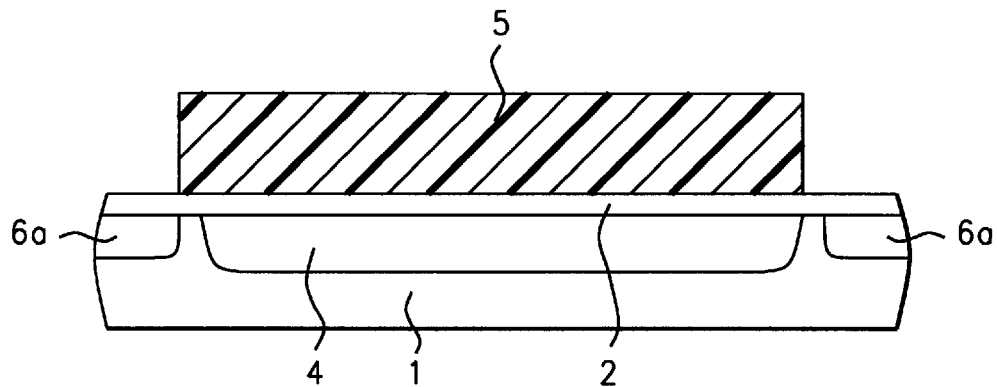
Figure 3:
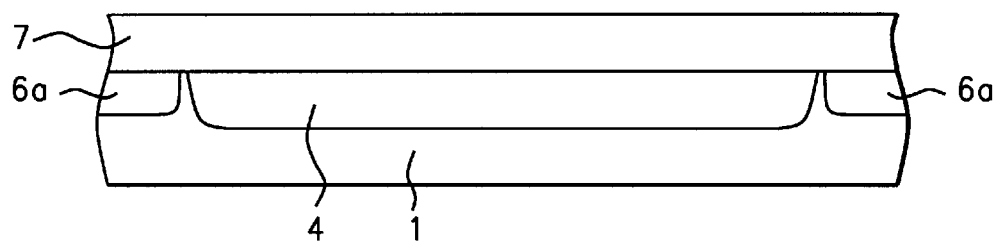

Photoresist shape 5, is next used as a mask, to allow ion implantation of boron ions, at an energy between about 30 to 50 KeV, and at a dose between about 2E13 to 4E13 atoms/cm$^2$, to be located in regions of semiconductor substrate 1, not protected by photoresist shape 5. After removal of photoresist shape 5, via plasma oxygen ashing and careful wet cleans, a anneal procedure is performed at a temperature between about 900 to 1000° C., in a oxygen ambient, activating the boron ions, and forming lower P type, isolation regions 6a, schematically shown in FIG. 2. After removal of silicon oxide layer 2, via use of a buffered hydrofluoric acid solution, followed by a careful wet clean procedure, N type epitaxial layer 7, is grown, at a temperature between about 1050 to 1150° C., to a thickness between about 5500 to 6500 Angstroms, using silane, disilane, or trichlorosilane, with the addition of arsine or phosphine, resulting in a resistivity, for N type epitaxial layer 7, of about 0.4 to 0.6 ohm-cm. This is schematically shown in FIG. 3.

Figure 4:
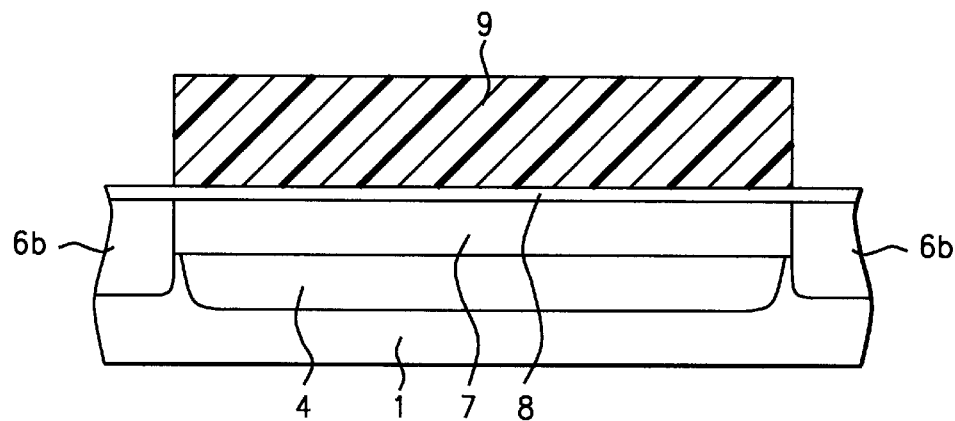

Ion implantation screen oxide layer, silicon oxide layer 8, is next thermally grown, to a thickness between about 200 to 300 Angstroms, and shown schematically in FIG. 4. Photoresist shape 9, is then employed as mask, to allow boron ions 6d, ion implanted at an energy between about 150 to 170 KeV, at a dose between about 5E12 to 7E12 atoms/cm$^2$, and boron ions 6c, ion implanted at an energy between about 30 to 50 KeV, at a dose between about 4E13 to 6E13 atoms/cm$^2$, to be placed in regions of N type, epitaxial layer 7, not protected by photoresist shape 9. This is schematically shown in FIG. 4. Removal of photoresist shape 9, is accomplished via plasma oxygen ashing and careful wet cleans. Boron ions 6d, and 6c, will subsequent link with lower P type, isolation regions 6a, during a subsequent thermal procedure, used to form field oxide regions, forming the complete, P type, isolation regions 6b.

Figure 5:
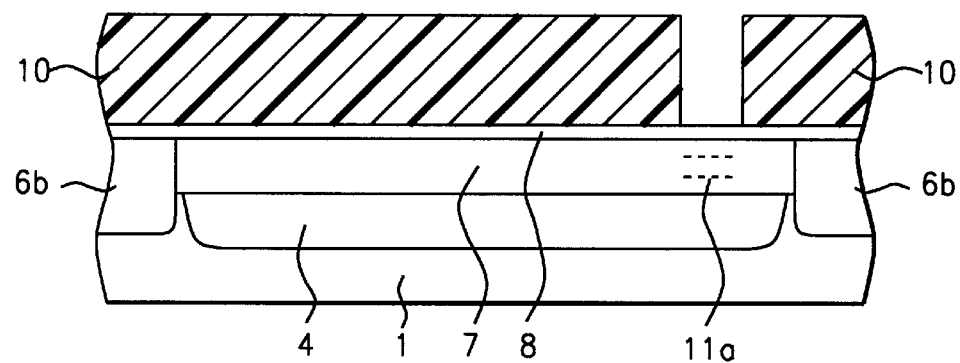
Figure 6:
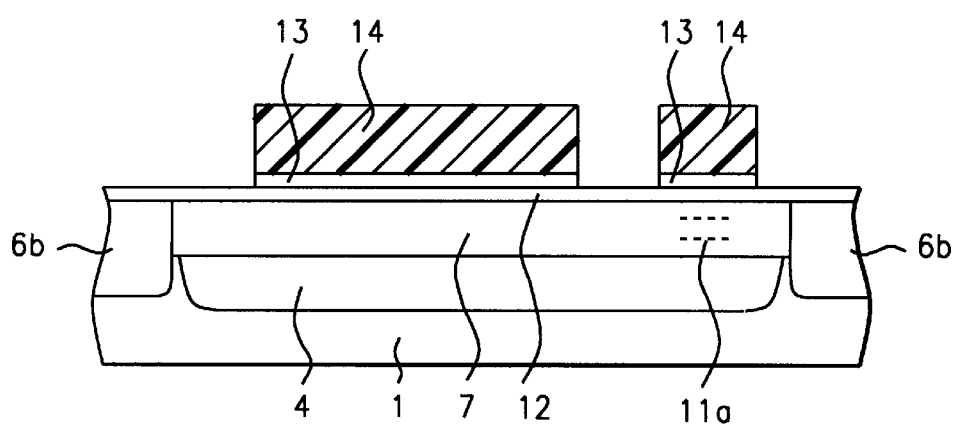

Photoresist shape 10, is next formed, and used as a mask to allow phosphorous ions 11a, to be placed in regions of N type epitaxial layer 7, via ion implantation procedures, performed at an energy between about 150 to 170 KeV, at a dose between about 0.9 to 1.1E14 atoms/cm$^2$, and performed at an energy between 70 to 90 KeV, at a dose between about 0.9E15 to 1.1E15 atoms/cm$^2$. This is schematically shown in FIG. 5. After removal of photoresist shape 10, via plasma oxygen ashing and careful wet cleans, followed by the removal of silicon oxide layer 8, via use of a buffered hydrofluoric acid solution, silicon oxide layer 12, is thermally grown, at a temperature between about 900 to 1050° C., to a thickness between about 300 to 400 Angstroms. A silicon nitride layer 13, is deposited via low pressure chemical vapor deposition, (LPCVD), or plasma enhanced chemical vapor deposition, (PECVD), procedures, to a thickness between about 1400 to 1600 Angstroms. Photoresist shape 14, schematically shown in FIG. 6, is used as a mask, to allow exposed portions of silicon nitride layer 13, to be removed via a reactive ion etching procedure, using CHF$_3$ as an etchant.

Figure 7:
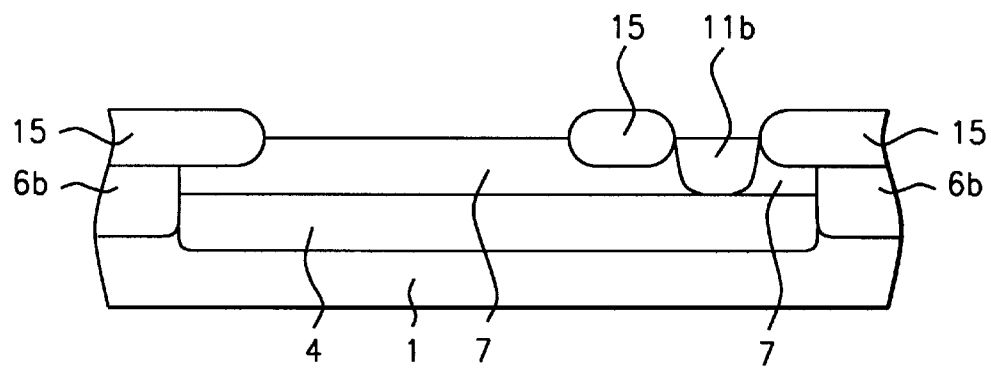

After removal of photoresist shape 14, via plasma oxygen ashing and careful wet cleans, field oxide, (FOX), regions 15, comprised of silicon oxide, and shown schematically in FIG. 7, are thermally grown, in an oxygen-steam ambient, to a thickness between about 5500 to 6500 Angstroms, at a temperature between about 900 to 950° C. Field oxide regions 15, are selectively grown in the regions of semiconductor substrate 1, not protected by the oxidation resistant, silicon nitride layer 13. The thermal cycle, used for the growth of FOX regions 15, results in activation of phosphorous ions 11a, creating collector reach through region 11b, as well as activating boron ion region 6c, and 6d, creating P type, isolation region 6b. The thermal cycle also results in diffusion of subcollector region 4, which now butts against P type, isolation regions 6b. The isolation of a specific BJT device is now complete, with the composite isolation region comprised of FOX regions 15, and P type, isolation region 6b. Silicon nitride layer 13, is next removed via use of a hot phosphoric acid solution, while silicon oxide layer 12, is removed using a buffered hydrofluoric acid solution. The results of these process steps is shown schematically in FIG. 7.

Figure 8:
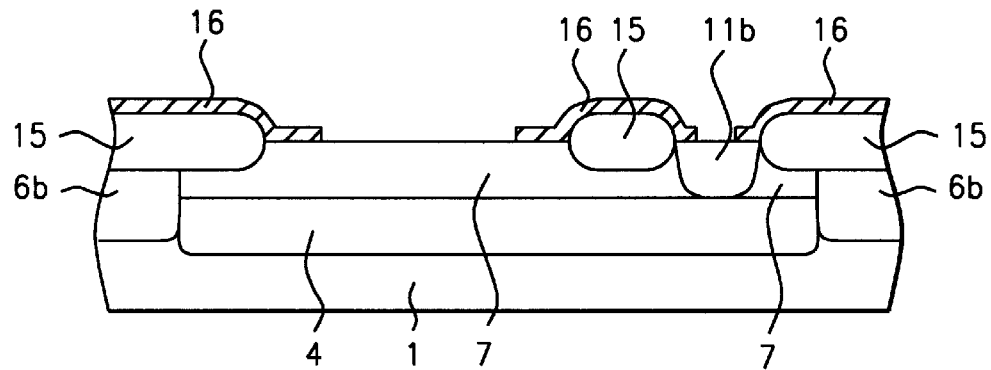

FIG. 8, schematically shows the formation of silicon seed layer 16, overlying FOX regions 15, and overlying a portion of N type epitaxial layer 7, in a region adjacent to FOX regions 15. Silicon seed layer 16, can be a polysilicon layer, or an amorphous silicon layer, deposited via LPCVD procedures, at a temperature between about 610 to 630° C., for polysilicon, or a temperature between about 550 to 570° C., for the amorphous silicon layer, both at a thickness between about 450 to 550 Angstroms, using silane, or disilane, as a source. Conventional photolithographic and RIE procedures, using Cl$_2$ as an etchant, are used to create the desired shape of silicon seed layer 16. This critical layer will allow a subsequent epitaxial silicon base layer to be grown overlying FOX regions 15, and to be used for the extrinsic, and intrinsic base regions of the BJT device. The accommodation of the intrinsic base region, in this layer, will remove the need for the formation of a specific polysilicon extrinsic base layer, which would have to be patterned, to create an opening, needed to subsequently allow a silicon region, underlying the polysilicon extrinsic base layer, to accommodate the formation of an intrinsic base region. Therefore the use of a polysilicon extrinsic base region would require additional design space, resulting in a larger than desired BJT device, with increased base to collector, as well as increased collector to substrate, capacitance. The photoresist shape, used to define silicon seed layer 16, is again removed via plasma oxygen ashing and careful wet cleans.

Figure 9:
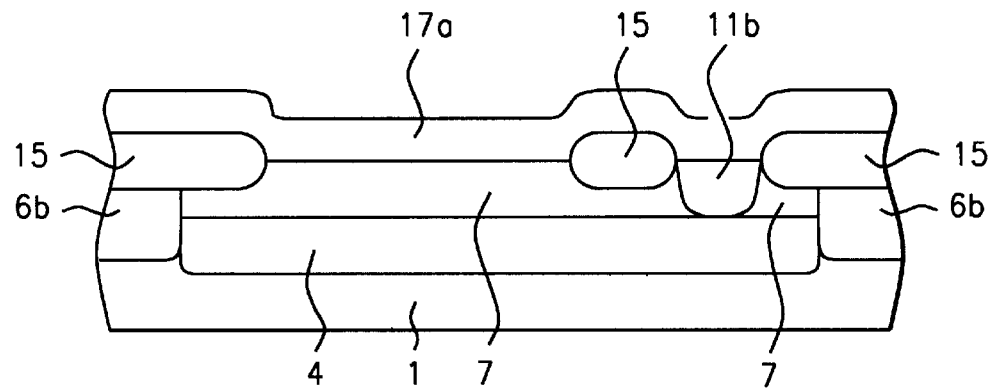
Figure 10:
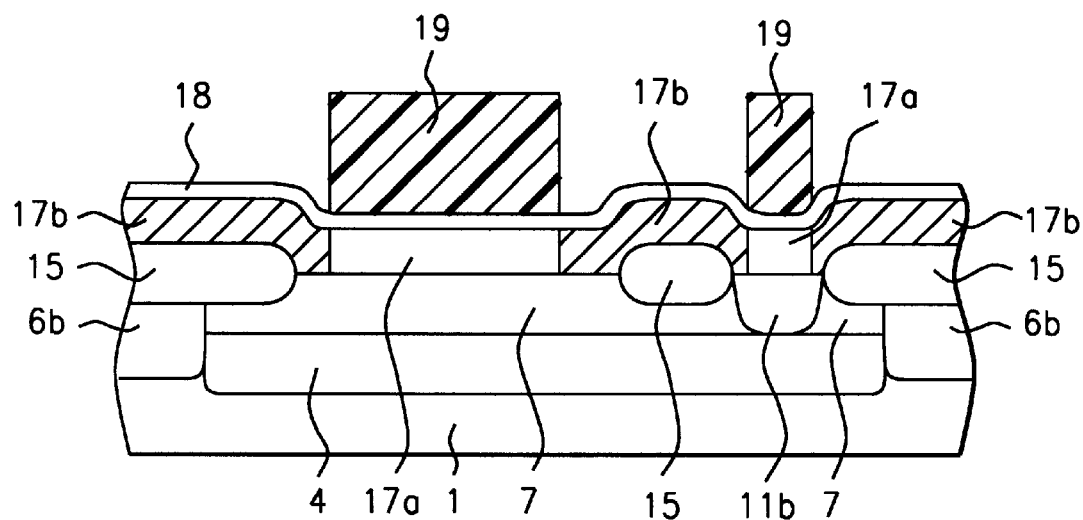

Epitaxial silicon base layer 17a, schematically shown in FIG. 9, is deposited at a temperature between about 850 to 1100° C., to a thickness between about 1000 to 3200 Angstroms, using silane, or disilane, as a source. Undoped epitaxial silicon base layer 17a, overlying N type, epitaxial silicon layer 7, is also formed on regions previously covered by silicon seed layer 16, resulting in a continuous epitaxial silicon base layer 17a. The epitaxial silicon base layer can also be formed doped, or doped and containing percentages of germanium. These options, reducing process complexity, will subsequently be described. Silicon oxide layer 18, is next formed, via thermal oxidation procedures, at a temperature between about 900 to 1000° C., to a thickness between about 225 to 275 Angstroms. If epitaxial silicon base layer 17a, is to contain germanium, silicon oxide layer 18, is grown at a temperature between about 650 to 750° C., to a thickness between about 150 to 200 Angstroms. Photoresist shape 19, is then formed, and used as a mask, to allow regions of undoped, epitaxial silicon base layer 17a, to accept a boron ion implantation procedure, performed at an energy between about 70 to 90 KeV, at a dose between about 4E15 to 6E15 atoms/cm$^2$, creating extrinsic base regions 17b. This is schematically shown in FIG. 10.

Figure 11:
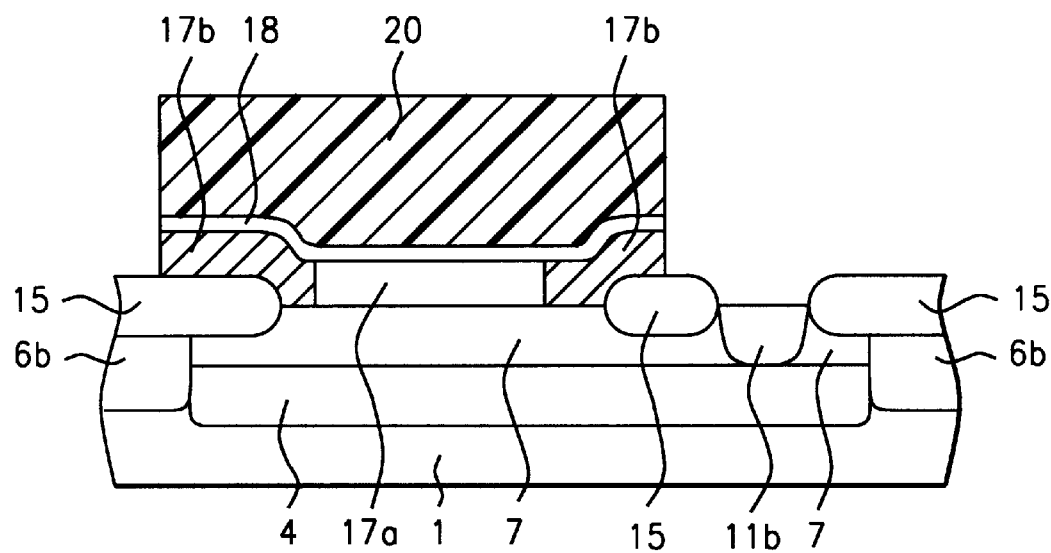
Figure 12:
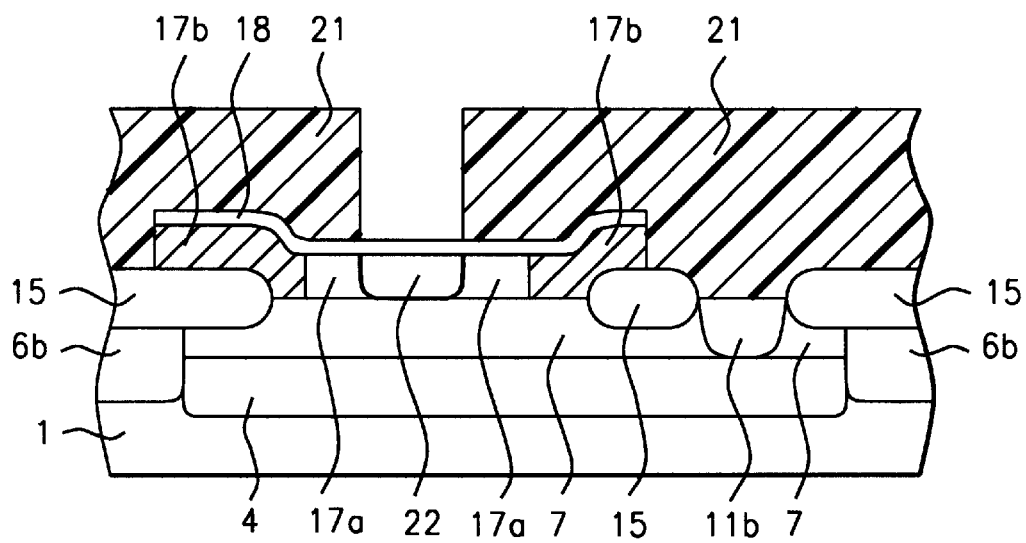

After removal of photoresist shape 19, via plasma oxygen ashing and careful wet cleans, another photoresist shape 20, is formed and used as an etch mask to allow the definition of the epitaxial silicon base layer to occur, via an RIE procedure, using $CHF_3$ as an etchant for silicon oxide layer 18, while using $Cl_2$ as an etchant for the epitaxial silicon base layer, which is now comprised of an undoped region 17a, as well as the doped, extrinsic base region 17b. This is schematically shown in FIG. 11. After removal of photoresist shape 20, via plasma oxygen ashing and careful wet cleans, an anneal procedure is employed, at a temperature between about 945 to 955° C., in a nitrogen ambient, to activate the dopants in extrinsic base region 17b. Photoresist shape 21, is next formed and used as a mask to allow an ion implantation procedure, using $BF_2$ ions, at an energy between about 55 to 65 KeV, at a dose between about 2E13 to 4E13 atoms/cm$^2$, to create intrinsic base region 22, in epitaxial silicon base region 17a. This is schematically shown in FIG. 12.

Figure 13:
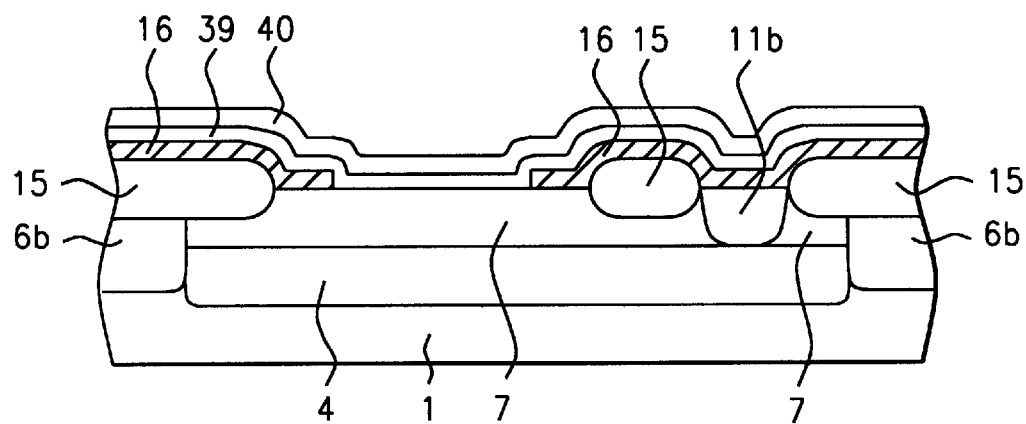

An alternative to deposition of an undoped, epitaxial silicon base layer, requiring intrinsic base processing, is the deposition of an epitaxial layer, already containing the needed intrinsic base dopants. This is schematically shown in FIG. 13. Referring back to FIG. 8, where silicon seed layer 16, is present, a composite, epitaxial silicon base layer, comprised of underlying layer, epitaxial layer 39, and overlying, undoped, epitaxial layer 40, are deposited on the exposed regions of N type epitaxial layer 7, as well as on silicon seed layer 16, at a temperature between about 550 to 850° C. Underlying epitaxial layer 39, can be a silicon layer, deposited to a thickness between about 450 to 550 Angstroms, with the addition of diborane to a silane, or to a disilane source, resulting in a surface concentration for epitaxial layer 39, between 4E18 to 6E18 atoms/cm$^3$. Epitaxial layer 40, is deposited, undoped, to a thickness between about 450 to 550 Angstroms, using silane, or disilane, as a source. The composite, epitaxial base layer is subjected to an extrinsic base procedure, however the need for the creation of an intrinsic base is eliminated, via the incorporation of the intrinsic base region, in the deposited, composite epitaxial base layer. Another alternative is the use of a epitaxial deposited, boron doped, (between about 4E18 to 6E18 atoms/cm$^3$, surface concentration), silicon-germanium layer, for use as underlying epitaxial layer 39. The atomic percent of germanium, in the silicon layer, is between about 10 to 30 percent. This is accomplished at a thickness between about 450 to 550 Angstroms, using between about 10 to 30 weight percent germanium. Overlying epitaxial layer 40, again would be an undoped, epitaxial silicon layer, at a thickness between about 450 to 550 Angstroms. Again the elimination of the procedures used to create an intrinsic base region, would be realized via use of the boron doped, silicon-germanium layer. The incorporation of germanium results in faster switching, or higher Ft for the BJT device.

Figure 14:
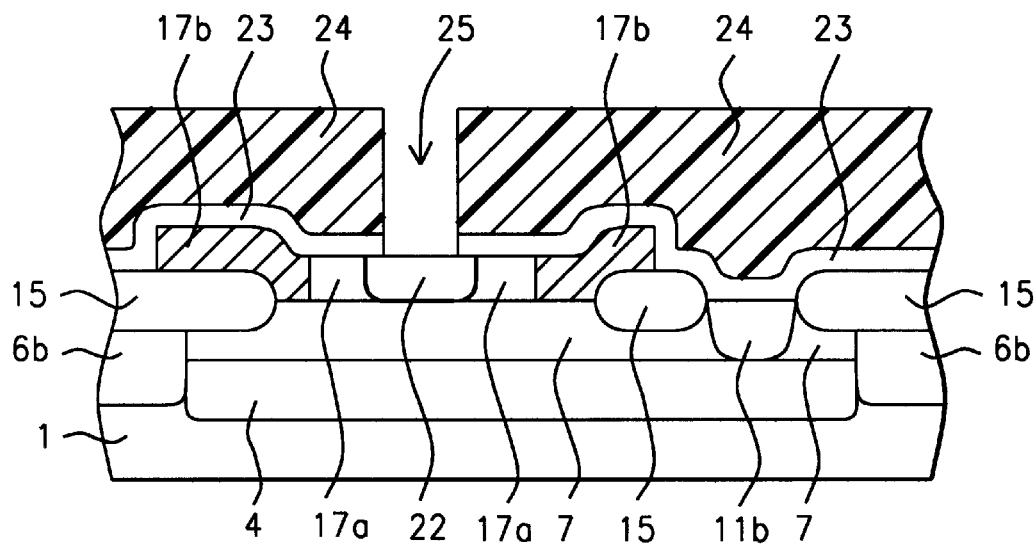
Figure 15:
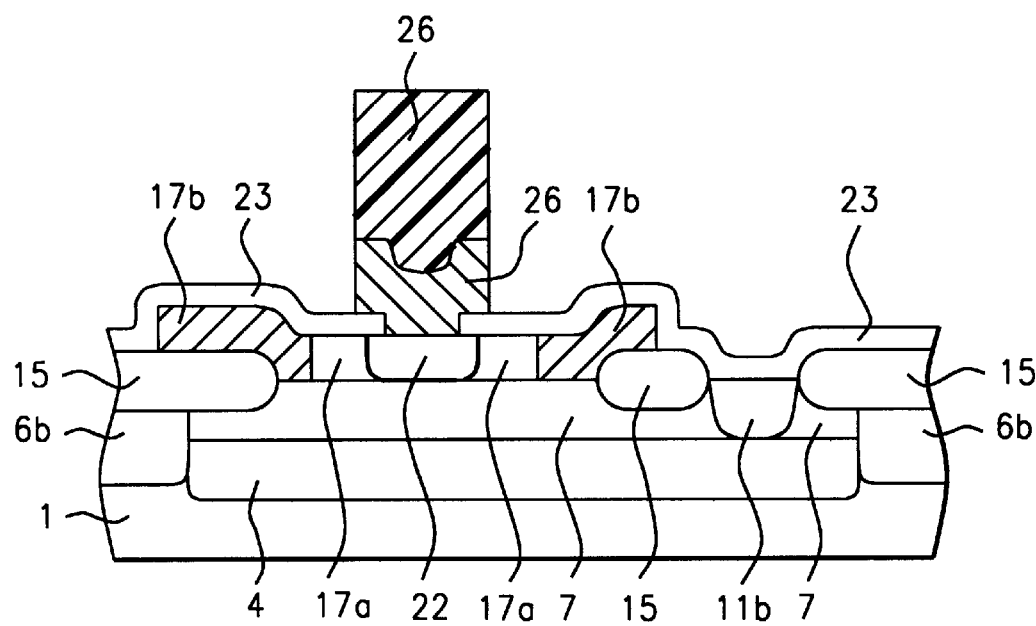

Referring back to FIG. 12, silicon oxide layer 18, can be removed, or retained if desired, while silicon oxide layer 23, is deposited via LPCVD or PECVD procedures, at a thickness between about 900 to 1100 Angstroms, using tetraethylorthosilicate, (TEOS), as a source. Photoresist shape 24, is used as an etch mask, allowing emitter contact hole 25, to be formed in silicon oxide layer 23, via either a RIE procedure, using $CHF_3$ as an etchant, or via a wet etching procedure, exposing a portion of the top surface of intrinsic base region 22. This is schematically shown in FIG. 14. After removal of photoresist shape 24, via plasma oxygen ashing and careful wet cleans, an undoped polysilicon layer 26, is deposited, via LPCVD procedures, at a thickness between about 2800 to 3200 Angstroms, then subjected to an arsenic ion implantation procedure, performed at an energy between about 70 to 90 KeV, at a dose between about 1E16 to 3E16 atoms/cm$^2$. Photoresist shape 27, is then used as a mask, allowing a RIE procedure, using $Cl_2$ as an etchant, to define polysilicon emitter structure, shown schematically in FIG. 15.

Figure 16:
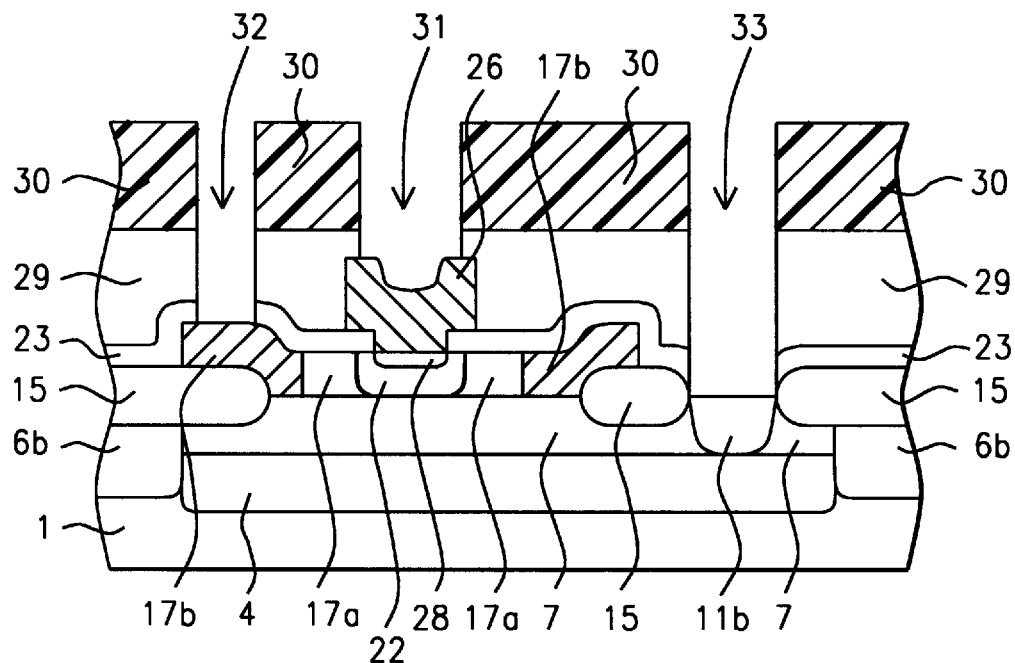

After removal of photoresist shape 27, via plasma oxygen ashing and careful wet cleans, an anneal procedure, such as rapid thermal anneal, is performed at a temperature between about 1000 to 1080° C., for a time between about 5 to 15 sec., in a nitrogen ambient, resulting in arsenic diffusion, from polysilicon emitter structure 26, creating emitter region 28, at a depth between about 1000 to 1500 Angstroms, in a top portion of intrinsic base region 22. The base width, of this BJT device, between about 450 to 550 Angstroms, is the thickness of epitaxial silicon base layer 17a, minus the depth of emitter region 28. This is schematically shown in FIG. 16.

Figure 17:
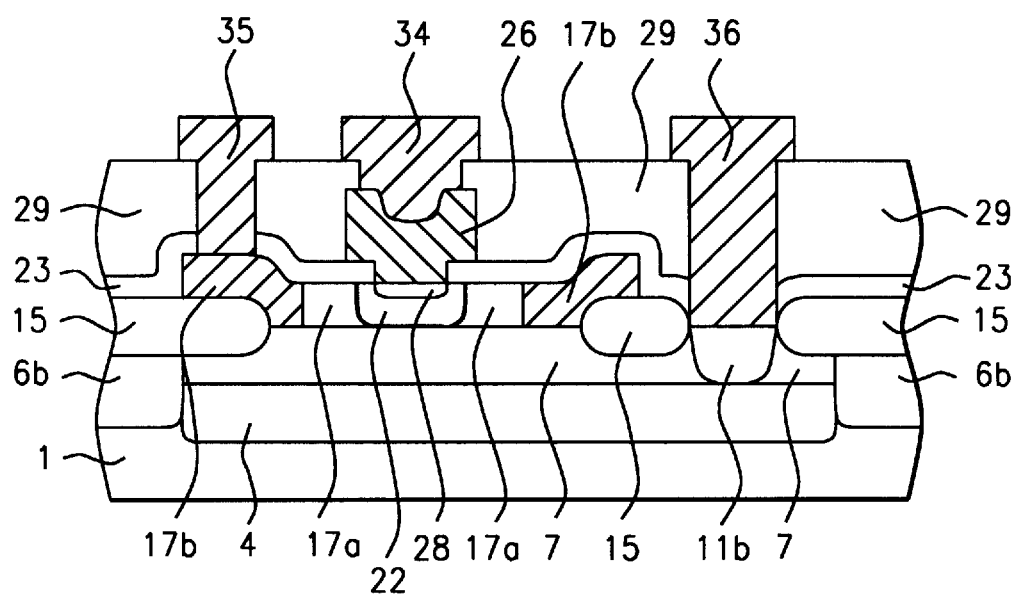

A composite insulator layer 29, comprised of an underlying silicon oxide layer, at a thickness between about 1250 to 1750 Angstroms, and an overlying boro-phosphosilicate layer, at a thickness between about 4000 to 5000 Angstroms, is next deposited via PECVD procedures. Photoresist shape 30, is then used as a mask to allow a RIE procedure, using $CHF_3$ as an etchant, to open: contact hole 31, exposing a portion of polysilicon emitter structure 26; to open contact hole 32, exposing a portion of extrinsic base region 17b; and contact hole 33, exposing collector reach through region 11b. This is schematically shown in FIG. 16. After removal of photoresist shape 30, via plasma oxygen ashing and careful wet cleans, an aluminum based layer, containing copper, and silicon, is deposited via R.F. sputtering, to a thickness between about 7000 to 9000 Angstroms. Conventional photolithographic and RIE procedures, using $Cl_2$ as an etchant, are used to create aluminum based structures 34, 35, and 36, in emitter, base, and collector, contact openings. This is schematically shown in FIG. 17. The photoresist shape, used to define the aluminum based structures, is again removed via plasma oxygen ashing and careful wet cleans.

While this invention has been particularly shown and described wit reference to, the preferred embodiment thereof, it will be understood by those skilled in the art that various changes in form and detail may be made without departing from the spirit and scope of this invention.

What is claimed is:

1. A method of fabricating a bipolar junction transistor, (BJT), on a semiconductor substrate, comprising the steps of;

forming a subcollector region, of a first conductivity type, in a first region of said semiconductor substrate, with said semiconductor substrate, comprised of a second conductivity type;

depositing a first epitaxial silicon layer, comprised with a dopant of said first conductivity type;

forming diffusion isolation regions, of said second conductivity type, in a first region of said first epitaxial silicon layer, and in a second region of said semiconductor substrate;

forming insulator isolation regions, in regions of said first epitaxial silicon layer, directly overlying said diffusion isolation regions;

forming a collector reach through region, of said first conductivity type, in a third region of said first epitaxial silicon layer, leaving a fourth region of said first epitaxial layer, as an active device region;

forming a silicon seed layer on said insulator isolation regions, and on portions of said active device region, adjacent to said insulator isolation regions;

forming a second epitaxial silicon layer, on said active device region, and on regions covered by said silicon seed layer;

forming an extrinsic base region, of said second conductivity type, in first regions of said second epitaxial silicon layer;

patterning of said second epitaxial silicon layer;

forming an intrinsic base region, of said second conductivity type, in a second region of said second epitaxial silicon layer;

forming an emitter opening, in a silicon oxide layer, exposing a portion of the top surface of said intrinsic base region;

forming a polysilicon emitter structure, comprised with a dopant of said first conductivity type, overlying and contacting the portion of said intrinsic base region, exposed in said emitter opening;

performing an annealing procedure, to form an emitter region, of said first conductivity type, in a top portion of said intrinsic base region; and forming metal contact structures, to said polysilicon emitter structure, to said extrinsic base region, and to said collector reach through region.

2. The method of claim 1, wherein said subcollector region is an N type region, formed via ion implantation of antimony, or arsenic ions, at an energy between about 70 to 90 KeV, at a dose between about 4E15 to 6E15 atoms/cm$^2$.

3. The method of claim 1, wherein said first epitaxial silicon layer, is an N type, epitaxial silicon layer, deposited at a temperature between about 1050 to 1150° C., to a thickness between about 5500 to 6500 Angstroms, using silane, or disilane, as a source, with the addition of arsine or phosphine, resulting in a resistivity for said first epitaxial silicon layer, between about 0.4 to 0.6 ohm-cm.

4. The method of claim 1, wherein said diffusion isolation regions, are P type regions, obtained via ion implantation of boron ions.

5. The method of claim 1, wherein said insulator isolation regions, are silicon oxide regions, obtained via thermal oxidation procedures, at a temperature between about 900 to 950° C., to a thickness between about 5500 to 6500 Angstroms.

6. The method of claim 1, wherein said silicon seed layer, is comprised of either polysilicon, or amorphous silicon, obtained via LPCVD procedures, to a thickness between about 450 to 550 Angstroms, using silane, or disilane as a source, then patterned via a RIE procedure, using $Cl_2$ as a source.

7. The method of claim 1, wherein said second epitaxial silicon layer is an undoped silicon layer, deposited at a temperature between about 850 to 1100° C., to a thickness between about 1000 to 3200 Angstroms, using silane, or disilane, as a source.

8. The method of claim 1, wherein said second epitaxial silicon layer is a composite layer, comprised of an underlying silicon layer, at a thickness between about 450 to 550 Angstroms, doped with boron, during deposition, resulting in a surface concentration between about 4E18 to 6E18 atoms/cm$^3$, and comprised of an overlying, undoped silicon layer, at a thickness between about 450 to 550 Angstroms.

9. The method of claim 1, wherein said second epitaxial silicon layer is a composite layer, comprised of an underlying, silicon-germanium layer, at a thickness between about 450 to 550 Angstroms, doped with boron, resulting in a surface concentration between about 4E18 to 6E18 atoms/cm$^3$, and containing between about 10 to 30 atomic percent germanium, and comprised of an overlying, undoped silicon layer, at a thickness between about 450 to 550 Angstroms.

10. The method of claim 1, wherein said extrinsic base region, is a P type region, formed in said first regions of said second epitaxial silicon layer, via ion implantation of boron ions, at an energy between about 70 to 90 KeV, at a dose between about 4E15 to 6E15 atoms/cm$^2$.

11. The method of claim 1, wherein said intrinsic base region, is a P type region, formed in said second region of said second epitaxial layer, via ion implantation of $BF_2$ ions, at an energy between about 55 to 65 KeV, at a dose between about 2E13 to 4E13 atoms/cm$^2$.

12. The method of claim 1, wherein said polysilicon emitter structure is an N type structure, obtained via deposition of a polysilicon layer, via LPCVD procedures, at a thickness between about 2800 to 3200 Angstroms, and doped via ion implantation of arsenic ions, at an energy between about 70 to 90 KeV, at a dose between about 1E16 to 3E16 atoms/cm$^2$, then patterned via an RIE procedure, using $Cl_2$ as an etchant.

13. The method of claim 1, wherein said annealing procedure, used to create said emitter region, in the top portion of said intrinsic base region, is performed using an RTA procedure, at a temperature between about 1000 to 1080° C., for a time between about 5 to 15 sec.

14. A method of fabricating a single polysilicon layer, bipolar junction transistor, (BJT), on a P type, semiconductor substrate, comprising the steps of:

forming an N+ subcollector region, in a first region of said P type, semiconductor substrate;

depositing an N type, epitaxial silicon layer;

forming P type isolation regions, in first regions of said N type, epitaxial silicon layer, with said P type isolation regions extending into second regions, of said P type, semiconductor substrate;

forming field oxide, (FOX), isolation regions, on said P type isolation regions;

forming an N type, collector reach through region, in a second region of said N type, epitaxial silicon layer;

forming a silicon seed layer on said FOX isolation regions, and on a portion of a third region of said N type, epitaxial silicon layer, located adjacent to said FOX isolation regions;

depositing a composite epitaxial silicon layer, on said silicon seed layer, and on said third region of said N type epitaxial silicon layer, with said composite epitaxial silicon layer comprised of an overlying undoped silicon layer, and an underlying, P type, doped silicon layer;

forming a P type, extrinsic base region, in first regions of said composite epitaxial layer, with an unprocessed, second region of said composite epitaxial silicon layer, employed as a P type, intrinsic base region;

patterning of said composite epitaxial silicon layer;

depositing a silicon oxide layer;

forming an emitter opening, in said silicon oxide layer, exposing a portion of the top surface of said P type, intrinsic base region;

forming an N type, polysilicon emitter structure, overlying, and contacting, said P type, intrinsic base region, at the bottom of said emitter opening;

performing an anneal procedure, to form an N type, emitter region, in a top portion of said P type, intrinsic base region, exposed in said emitter opening, via diffusion from overlying N type, polysilicon emitter structure;

depositing a thick insulator layer;

opening contact holes in said thick insulator layer, to expose a portion of the top surface of: said N type, polysilicon emitter structure; said P type, extrinsic base region; and said N type, collector reach through region; and forming metal contact structures, in said contact holes, to said N type, polysilicon emitter structure, to said P type, extrinsic base structure, and to said N type, collector reach through region.

15. The method of claim 14, wherein said N type, epitaxial silicon layer is deposited at a temperature between about 1050 to 1150° C., to a thickness between about 5500 to 6500 Angstroms, using silane, or disilane, as a source, with the addition of arsine, or phosphine, resulting in a resistivity between about 0.4 to 0.6 ohm-cm.

16. The method of claim 14, wherein said silicon seed layer, is a polysilicon, or an amorphous silicon layer, obtained via LPCVD procedures, to a thickness between about 450 to 550 Angstroms, using silane, or disilane, as a source.

17. The method of claim 14, wherein said composite epitaxial silicon layer is deposited at a temperature between about 850 to 1100° C., comprised of an underlying, P type doped, silicon layer, at a thickness between about 450 to 550 Angstroms, with a P type, surface concentration between about 4E18 to 6E18 atoms/cm$^3$, and comprised of an overlying, undoped silicon layer, at a thickness between about 450 to 550 Angstroms.

18. The method of claim 14, wherein said composite epitaxial silicon layer is comprised of an underlying, P type, doped, silicon-germanium layer, at a thickness between about 450 to 550 Angstroms, with a P type, surface concentration between about 4E18 to 6E18 atoms/cm$^3$, containing between about 10 to 30 atomic percent germanium, and comprised of an overlying, undoped silicon layer, at a thickness between about 450 to 550 Angstroms.

19. The method of claim 14, wherein said P type, extrinsic base region, is formed in said first regions of said composite epitaxial silicon layer, via ion implantation of boron ions, at an energy between about 70 to 90 KeV, at a dose between about 4E15 to 6E15 atoms/cm$^2$.

20. The method of claim 14, wherein said N type, polysilicon emitter structure, is formed via RIE patterning of a polysilicon layer, using $Cl_2$ as an etchant, wherein the polysilicon layer was obtained using LPCVD procedures, at a thickness between about 2800 to 3200 Angstroms, and doped via ion implantation of arsenic ions, at an energy between about 70 to 90 KeV, at a dose between about 1E16 to 3E16 atoms/cm$^2$.

21. The method of claim 14, wherein said N type, emitter region, located in a top portion of said P type, intrinsic base region, is formed via diffusion from said N type, polysilicon emitter structure, via use of said anneal procedure, performed using an RTA procedure, at a temperature between about 1000 to 1080° C., for a time between about 5 to 15 sec.

* * * * *